United States Patent
Eichmann et al.

(10) Patent No.: US 8,012,562 B2
(45) Date of Patent: Sep. 6, 2011

(54) WEAR-RESISTANT COATING

(75) Inventors: Wolfgang Eichmann, Puchheim (DE);
Falko Heutling, Munich (DE); Thomas Uihlein, Dachau (DE)

(73) Assignee: MTU Aero Engines GmbH (DE)

( * ) Notice: Subject to any disclaimer, the term of this patent is extended or adjusted under 35 U.S.C. 154(b) by 38 days.

(21) Appl. No.: 12/163,677

(22) Filed: Jun. 27, 2008

(65) Prior Publication Data

US 2008/0317998 A1    Dec. 25, 2008

Related U.S. Application Data

(63) Continuation of application No. PCT/DE2007/000018, filed on Jan. 10, 2007.

(30) Foreign Application Priority Data

Jan. 13, 2006 (DE) .......... 10 2006 001 864

(51) Int. Cl.
*B32B 5/12* (2006.01)
*B32B 7/00* (2006.01)

(52) U.S. Cl. ........ 428/119; 427/566; 427/567; 428/141; 428/148; 428/622; 428/623; 428/627; 428/632; 428/633; 428/635; 428/670

(58) Field of Classification Search .......... 428/199, 428/119, 141, 148, 622, 623, 627, 632, 633, 428/635, 670; 427/566, 567
See application file for complete search history.

(56) References Cited

U.S. PATENT DOCUMENTS

| | | | | |
|---|---|---|---|---|
| 5,242,264 A | * | 9/1993 | Kojima et al. | 415/200 |
| 5,687,679 A | | 11/1997 | Mullin et al. | |
| 6,183,884 B1 | * | 2/2001 | Rickerby | 428/623 |
| 6,764,779 B1 | | 7/2004 | Liu et al. | |
| 2005/0013994 A1 | | 1/2005 | Strangman | |
| 2005/0112412 A1 | * | 5/2005 | Darolia et al. | 428/702 |
| 2007/0190351 A1 | * | 8/2007 | Eichmann et al. | 428/622 |

FOREIGN PATENT DOCUMENTS

| | | |
|---|---|---|
| DE | 102004001392 A1 * | 8/2005 |
| EP | 0 415 217 | 3/1991 |
| EP | 0 940 480 | 9/1999 |
| EP | 0 962 545 | 7/2002 |
| EP | 1 536 039 | 6/2005 |
| GB | 2 252 567 | 2/1991 |
| GB | 2 398 799 | 9/2004 |
| WO | WO 93/18199 | 9/1993 |

OTHER PUBLICATIONS

International Search Report corresponding to International Application Serial No. PCT/DE2007/000018, completed Jun. 26, 2007.

* cited by examiner

*Primary Examiner* — Brent T O'Hern

(74) *Attorney, Agent, or Firm* — McAndrews, Held & Malloy, Ltd.

(57) ABSTRACT

The present technology generally relates to a wear-resistant coating, especially for gas turbine components, comprising a horizontally segmented or multilayered structure, i.e. at least one relatively hard, ceramic layer and at least one relatively soft, metallic layer. The ceramic layer and the metallic layer are alternately arranged on top of each other in such a way that an external layer forming an external surface of the wear-resistant coating is embodied as a ceramic layer. According to the invention, at least the external, ceramic layer is segmented in a column-type manner in a vertical direction.

22 Claims, 3 Drawing Sheets

US 8,012,562 B2

WEAR-RESISTANT COATING

RELATED APPLICATIONS

This application is a continuation of International Application No. PCT/DE2007/000018 (International Publication Number WO/2007/079721), having an International filing date of Jan. 10, 2007 entitled "Verschleissschutzbeschichtung" ("Wear-Resistant Coating"). International Application No. PCT/DE/2007/000018 claimed priority benefits, in turn, from German Patent Application No. 10 2006 001 864.8, filed Jan. 13, 2006. International Application No. PCT/DE/2007/000018 and German Application No. 10 2006 001 864.8 are hereby incorporated by reference herein in their entireties.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present technology relates to a wear-resistant coating. More specifically, the presently described technology relates to a gas turbine component having a wear-resistant coating.

It is a known practice to provide the surfaces of gas turbine components with wear-resistant coatings to provide protection against wear, in particular for protection against corrosion. Wear-resistant coatings having a horizontally segmented or multilayered structure are known from the state of the art, comprising at least one relatively hard ceramic layer and at least one relatively soft metallic layer. The ceramic layers and the metallic layers of such multilayered or horizontally segmented wear-resistant coatings are alternatingly positioned on top of one another in such a way that an external layer which forms an external surface of the wear-resistant coating is designed as a ceramic layer. Such multilayered or horizontally segmented wear-resistant coatings are also referred to as multilayer wear-resistant coatings. In multilayer wear-resistant coatings, known from the prior art, the relatively hard ceramic layers as well as the relatively soft metallic layers are characterized by a compact, dense, self-contained layered structure. Such wear-resistant coatings are relatively sensitive to erosion. When these are subjected to particle erosion attack, after a relatively brief initiation phase, the wear-resistant coating begins to flake off over a large surface area, particularly in the region of the external layer of the multilayer wear-resistant coating which forms the outer surface of the wear-resistant coating. This is disadvantageous.

BRIEF SUMMARY OF THE INVENTION

Proceeding therefrom, it is one aspect of the presently described technology to provide a novel wear-resistant coating, and to provide a gas turbine component having such a wear-resistant coating.

This aspect is achieved by providing a wear-resistant coating accordingly having a horizontally segmented or multilayered structure, i.e., at least one relatively hard ceramic layer. According to the present technology, at least the external ceramic layer is vertically segmented in the manner of a column.

In the sense of the present technology, at least the external layer of the horizontally segmented or multilayered wear-resistant coating is vertically segmented in the manner of a column. As a result of the columnar segmentation of the wear-resistant coating at least in the region of the external layer thereof, the flaking of the wear-resistant coating caused by particle erosion attack, for example, is limited to very small spatial areas, so that the wear-resistant coating according to the presently described technology has good erosion resistance. Between the columns of the external layer of the wear-resistant coating which is segmented in a columnar manner, interfaces are provided which hinder the growth of microcracks caused by wear stresses such as erosion stresses, for example. Instead, the interfaces cause intense branching of the microcracks, forming crack networks in small material volumes. The formation of such intensely branched crack networks is associated with a high degree of energy absorption, so that the wear-resistant coating, according to the presently described technology, is able to easily absorb the energy which acts thereon during particle erosion attack. Spreading of flaking regions of the wear-resistant coating, as the result of particle erosion attack, can thus be effectively prevented.

According to one advantageous refinement of the present technology, at least the external ceramic layer, which is vertically segmented in the manner of a column, has a nanostructured design.

According to a further advantageous refinement of the present technology, at least the external ceramic layer and the ceramic layer adjoining the external layer with introduction of a metallic interlayer are vertically segmented in the manner of a column.

Alternatively, each layer which is vertically segmented in the manner of a column is structured either as, for example, a columnar pillar, a columnar rod, or a columnar fiber.

Preferred refinements of the present technology result from the appended claims and the following description. Without limiting the present technology thereto, exemplary embodiments are explained in greater detail with reference to the drawings, which are identified below.

DETAILED DESCRIPTION OF THE INVENTION

Before the present technology is described in greater detail below with reference to FIGS. 2 through 7, the present state of the art is presented with reference to FIG. 1.

Figure 1:
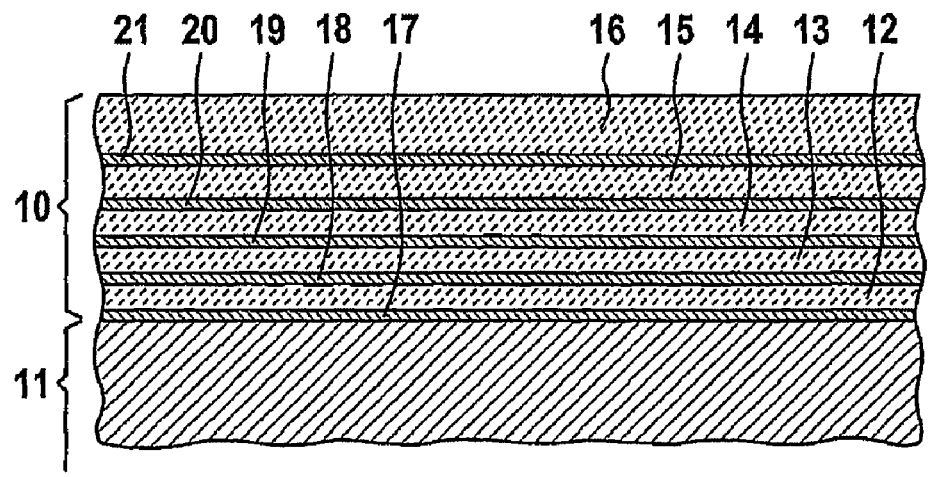
FIG. 1 shows a schematic illustration of a previously known wear-resistant coating which is applied to a gas turbine component.

FIG. 1 illustrates a known wear-resistant coating 10, which is applied to an outer surface of a gas turbine component 11. The wear-resistant coating 10 in FIG. 1 has a multilayered structure, and consequently is horizontally segmented. The multilayered or horizontally segmented wear-resistant coating 10 has multiple relatively hard ceramic layers 12, 13, 14, 15, and 16, as well as multiple relatively soft metallic layers 17, 18, 19, 20, and 21. The ceramic layers 12 through 16 and the metallic layers 17 through 21 are each alternatingly positioned on top of one another in such a way that a metallic layer 18 or 19 or 20 or 21 is respectively provided between adjacent ceramic layers 12 and 13, or 13 and 14, or 14 and 15, or 15 and 16.

An external layer 16 of the wear-resistant coating 10, which forms an outer surface of the wear-resistant coating, is designed as a ceramic layer. In contrast, an internal layer 17 of the wear-resistant coating which is applied to the surface of the gas turbine component 11 is designed as a metallic layer. In the wear-resistant coating 10, according to FIG. 1 known from the current state of the art, all relatively hard ceramic layers 12 through 16 as well as all relatively soft metallic layers 17 through 21 are designed as compact or dense self-contained layers.

Such wear-resistant coatings known from the current state of the art are relatively sensitive to erosion because they are not able to easily absorb the energy acting thereon during, for example, particle erosion attack. Instead, such wear-resistant coatings form cracks over large surface areas, such that after a relatively brief initiation phase, the wear-resistant coating known from the current state of the art begins to flake off over a large surface area.

Figure 2:
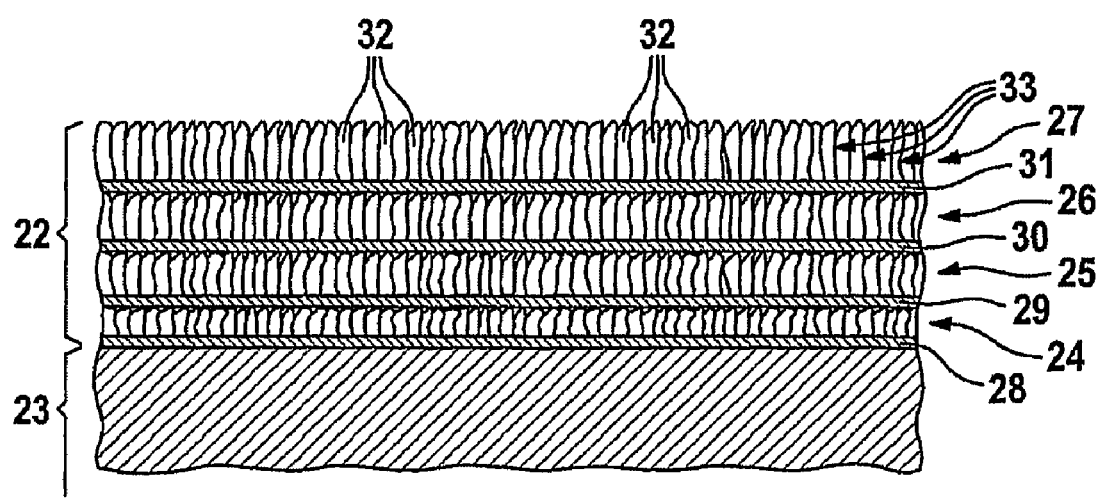
FIG. 2 shows a schematic illustration of a wear-resistant coating according to the present technology which is applied to a gas turbine component according to a first exemplary embodiment of the present technology.

FIG. 2 shows a first exemplary embodiment of a wear-resistant coating 22 according to the present technology which is applied to a gas turbine component 23. The wear-resistant coating 22 in FIG. 2 once again has multiple relatively hard ceramic layers 24, 25, 26, and 27 as well as multiple relatively soft metallic layers 28, 29, 30, and 31. The relatively hard ceramic layers 24 through 27 and the relatively soft metallic layers 28 through 31 are applied to the gas turbine component 23 in alternation on top of one another, specifically in such a way that a metallic layer 29 or 30 or 31 is respectively provided between two adjacent ceramic layers 24 and 25, or 25 and 26, or 26 and 27. An external layer 27 which forms an outer surface of the wear-resistant coating 22 is designed as a ceramic layer. An internal layer 28 which is applied directly to the gas turbine component 23 is designed as a metallic layer.

In the wear-resistant coating 22 according to the presently described technology, at least the external ceramic layer 27 which forms the outer surface of the wear-resistant coating is vertically segmented in the manner of a column. In the exemplary embodiment of FIG. 2, all of the ceramic layers 24, 25, 26, and 27, including the external ceramic layer 27, are vertically segmented in the manner of a column. Columns 32 which are separated from one another by interfaces 33 are thus formed inside each of the ceramic layers 24 through 27.

In the exemplary embodiment of FIG. 2, the interfaces 33 extend between the columns 32 of all the ceramic layers 24 through 27 which are vertically segmented in the manner of a column, approximately perpendicular to the surface of the gas turbine component. Thus, in the exemplary embodiment of FIG. 2 the columns 32 of all ceramic layers 24 through 27 which are segmented in the manner of a column have the same orientation, with the columns 32 of all ceramic layers 24 through 27 which are segmented in the manner of a column extending perpendicular to the surface of the gas turbine component 23, and therefore not being inclined relative to the surface of the gas turbine component 23.

As a result of the above-described columnar segmentation of at least the external ceramic layer 27 of the wear-resistant coating 22, the forces acting on the wear-resistant coating 22 during particle erosion attack, for example, may be easily absorbed. Spreading of microcracks produced by particle erosion attack, for example, is hindered by the interfaces 33. In this manner, any flaking of the external layer 27 of the wear-resistant coating 22 is limited to very small spatial areas, such that the wear-resistant coating 22 according to the presently described technology has good erosion resistance.

Figure 3:
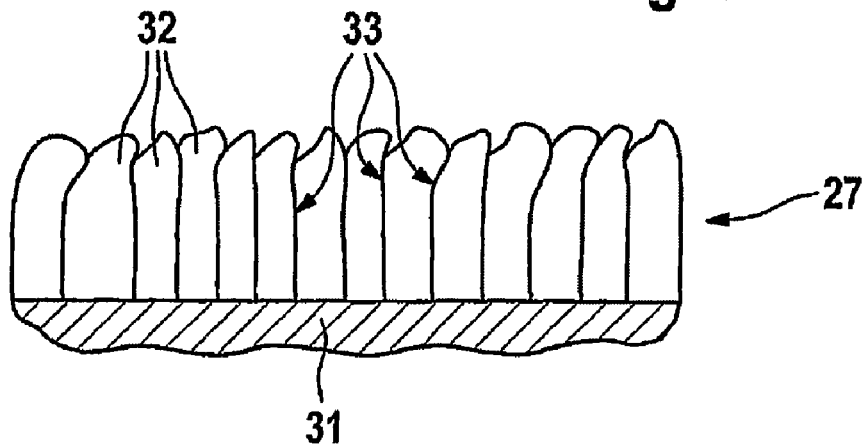
FIG. 3 shows a detail of the wear-resistant coating according to FIG. 2, in which the external ceramic layer is structured as a columnar pillar.
Figure 4:
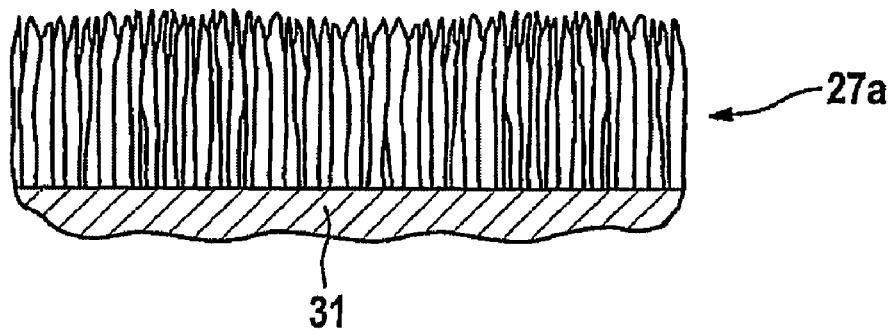
FIG. 4 shows an alternative detail of the wear-resistant coating according to FIG. 2, in which the external ceramic layer is structured as a columnar rod.
Figure 5:
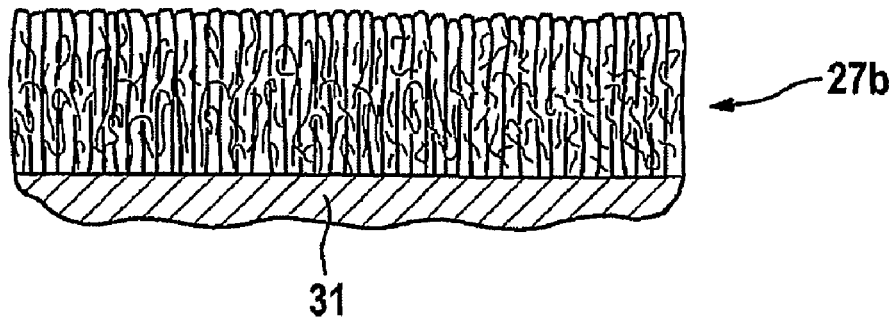
FIG. 5 shows an alternative detail of the wear-resistant coating according to FIG. 2, in which the external ceramic layer is structured as a columnar fiber.

FIG. 3 shows in additional detail the wear-resistant coating 22 in the region of the external ceramic layer 27, which forms the outer surface of the wear-resistant coating 22 and is vertically segmented in the manner of a column. Thus, the layer 27 according to FIG. 3 is structured as a columnar pillar. Alternatively, the external ceramic layer as well as any other layer that is segmented in the manner of a column may be structured as, for example, a columnar rod or as a columnar fiber. FIG. 4 shows a layer 27a structured as a columnar rod. FIG. 5 shows a layer 27b structured as a columnar fiber.

In the exemplary embodiment of FIG. 2, the relatively soft metallic layers 28, 29, 30, and 31 are designed as compact, dense layers which are therefore vertically unsegmented. The metallic layers 28 through 31 may also optionally be segmented in the manner of a column. In addition, it is possible for only a portion of the metallic layers to be segmented in the manner of a column.

Figure 6:
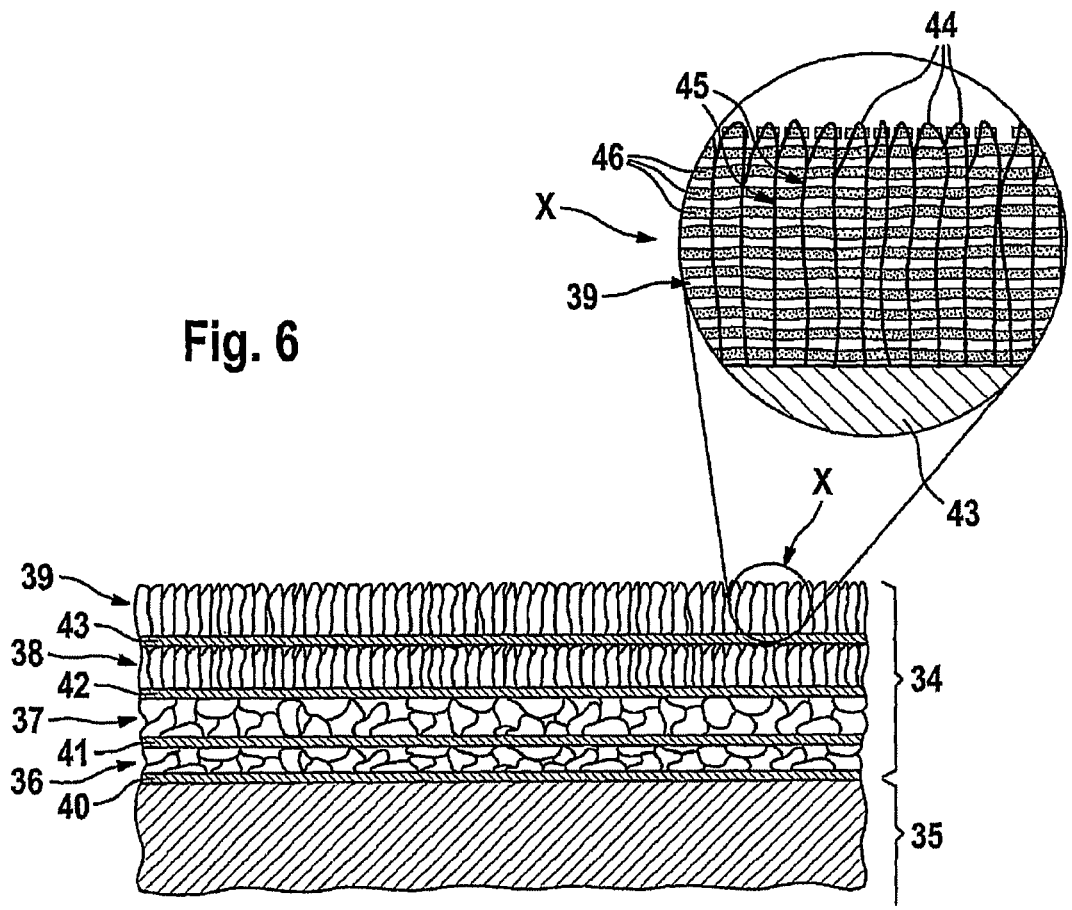
FIG. 6 shows a schematic illustration of a wear-resistant coating according to the present technology which is applied to a gas turbine component according to a second exemplary embodiment of the present technology.

FIG. 6 shows a further exemplary embodiment of a wear-resistant coating 34 according to the present technology which is applied to a gas turbine component 35.

The wear-resistant coating 34 of the exemplary embodiment of FIG. 6 has multiple relatively hard ceramic layers 36, 37, 38, and 39 as well as multiple relatively soft metallic layers 40, 41, 42, and 43, which once again, are applied to the gas turbine component 35 in alternation on top of one another. In the exemplary embodiment of FIG. 6, only two ceramic layers are vertically segmented in the manner of a column, namely, the external layer 39 which forms the outer surface of the wear-resistant coating 34, and the ceramic layer 38 adjoining the external layer 39 with introduction of the metallic interlayer 43. In contrast, the two internal ceramic layers 36 and 37 are vertically unsegmented, but have a nanocrystalline structure.

In the ceramic layers 38 and 39, which are vertically segmented in the manner of a column, once again, multiple columns 44 are provided which are separated from one another by interfaces 45. In the exemplary embodiment of FIG. 6, the columns 44 and therefore the interfaces 45, the same as in the exemplary embodiment of FIG. 2, extend approximately perpendicular to the surface of the gas turbine component, and in the exemplary embodiment of FIG. 6, the columns 44 or interfaces 45 therefore, are not inclined relative to the gas turbine component.

In the exemplary embodiment of FIG. 6, the external ceramic layer 39, which is vertically segmented in the manner of a column, has a nanostructured design. Detail X in FIG. 6 shows that in the illustrated exemplary embodiment the external layer 39 has a nanostructured design. According to detail X, multiple nanolayers 46 are positioned on top of one another, with the nanolayers 46 extending essentially horizontally and having a thickness of <1 μm. Thus, for example, nanolayers 46 made of different materials may be alternatingly positioned on top of one another, so that the ceramic layer 39 itself, which is vertically segmented in the manner of a column, is also horizontally segmented by the nanolayers 46.

As an alternative or in addition to the nanolayered structuring of the external ceramic layer 39, said layer may have a nanocrystalline design.

The individual nanolayers 46 may also be produced from nanograded materials.

Figure 7:
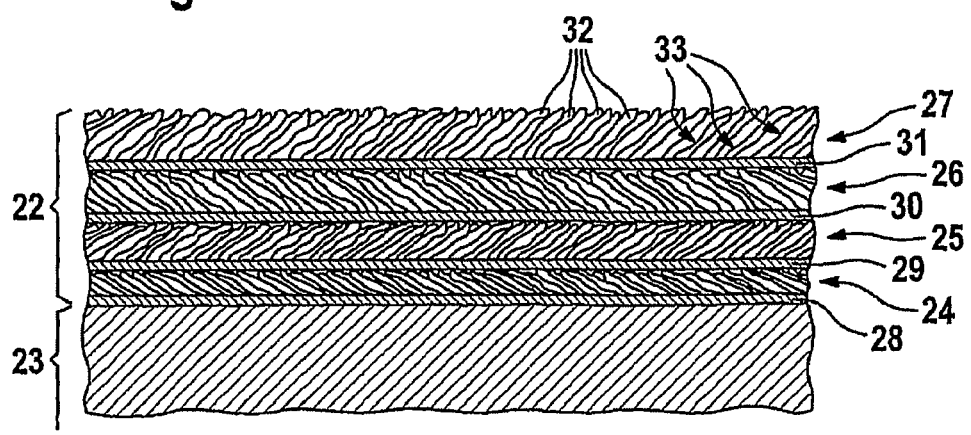
FIG. 7 shows a schematic illustration of a wear-resistant coating according to the present technology which is applied to a gas turbine component according to a third exemplary embodiment of the present technology.

FIG. 7 shows a further exemplary embodiment of a wear-resistant coating according to the present technology, wherein in principle, the wear-resistant coating of FIG. 7 has the design of the wear-resistant coating of FIG. 2. Thus, to avoid unnecessary repetition in the exemplary embodiment of FIG. 7, the same reference numerals are used as for the exemplary embodiment of FIG. 2. Therefore, the discussion below addresses only the details according to which the exemplary embodiment of FIG. 7 differs from the exemplary embodiment of FIG. 2.

The exemplary embodiment of FIG. 7 differs from the exemplary embodiment of FIG. 2 in that the ceramic layers 24 through 27 are vertically segmented in the manner of a column in such a way that, with introduction of a respective metallic interlayer 29 or 30 or 31, successive ceramic layers 24 and 25, or 25 and 26, or 26 and 27 are vertically segmented with different orientations in the manner of a column. FIG. 7 shows that the columns 32 and thus the interfaces 33 of the ceramic layer 27 which is segmented in the manner of a column are inclined relative to the surface of the gas turbine component 23 in a different direction than the columns 32 of the ceramic layer 26 which is also segmented in the manner of a column. Thus, in the exemplary embodiment of FIG. 7, the columns of the ceramic layers which are successively positioned with the introduction of a metallic interlayer are inclined in different directions relative to the surface of the gas turbine component, this inclination being observed in three-dimensional space.

The columns of adjacent layers which are segmented in the manner of a column may have a difference in orientation, i.e., a difference in inclination, between 0° and 180°, preferably between 5° and 120°. For a difference in orientation of 0°, the columns of adjacent layers which are segmented in the manner of a column extend with the same orientation with respect to the surface of the gas turbine component.

In the exemplary embodiment of FIG. 7, the columns 32 may have practically any given angle relative to the surface of the gas turbine component 23. Successive ceramic layers which are separated from one another by a metallic layer are inclined in different directions. As a result of these differences in orientation, for a given external stress, the development of tension in the individual layers of the wear-resistant coating may be influenced in a targeted manner. This is another advantage of the presently described technology.

Finally, it is noted and will be appreciated by those familiar with the art that a bonding layer may be provided between the wear-resistant coating 22 or 34 according to the presently described technology and the gas turbine component 23 or 35 on which the wear-resistant coating 22 or 34 according to the present technology is applied. The wear-resistant coating according to the invention is preferably produced by the Physical Vapor Deposition (PVD) sputtering technique.

The present technology has now been described in such full, clear, concise and exact terms as to enable a person familiar in the art to which it pertains, to practice the same. It is to be understood that the foregoing describes preferred embodiments and examples of the present technology and that modifications may be made therein without departing from the spirit or scope of the invention as set forth in the claims. Moreover, while particular elements, embodiments and applications of the present technology have been shown and described, it will be understood, of course, that the present technology is not limited thereto since modifications can be made by those familiar in the art without departing from the scope of the present disclosure, particularly in light of the foregoing teachings and appended claims. Moreover, it is also understood that the embodiments shown in the drawings, if any, and as described above are merely for illustrative purposes and not intended to limit the scope of the invention, which is defined by the following claims as interpreted according to the principles of patent law, including the Doctrine of Equivalents. Further, all references cited herein are incorporated in their entirety.

The invention claimed is:

1. A wear-resistant coating having an alternating layered structure comprising a plurality of relatively hard ceramic layers and a plurality of relatively soft metallic layers, wherein the ceramic layers and the metallic layers are alternatingly positioned on top of one another such that an external layer, which forms an outer surface of the wear-resistant coating, is designed as a ceramic layer, wherein the external ceramic layer and a ceramic layer nearest the external layer are vertically segmented in the manner of a column such that each of the external ceramic layer and the ceramic layer nearest the external layer comprise layer columns, the layer columns extending through the layer in which the layer columns are located, the layer columns extending approximately perpendicular to a surface of a gas turbine component to which the wear-resistant coating is applied, wherein a metallic interlayer is interposed between the external ceramic layer and the ceramic layer nearest the external layer, and wherein said coating is used as a coating for gas turbine components.

2. The wear-resistant coating of claim 1, wherein all ceramic layers are vertically segmented in the manner of a column.

3. The wear-resistant coating of claim 1, wherein all metallic layers are compactly or vertically unsegmented.

4. The wear-resistant coating of claim 1, wherein the metallic layers are vertically segmented in the manner of a column.

5. The wear-resistant coating of claim 1, wherein the external ceramic layer which is vertically segmented in the manner of a column is segmented in the form of a columnar pillar, columnar rod, or columnar fiber.

6. The wear-resistant coating of claim 1, wherein the external ceramic layer which is vertically segmented in the manner of a column has a nanostructured design.

7. The wear-resistant coating of claim 1, wherein the external ceramic layer has a nanocrystalline design.

8. The wear-resistant coating of claim 1, wherein the external ceramic layer has a nanolayered design.

9. The wear-resistant coating of claim 1, wherein successive ceramic layers are segmented with different orientations in the manner of a column.

10. The wear-resistant coating of claim 9, wherein said columns of successive ceramic layers are inclined in different directions in three-dimensional space.

11. The wear-resistant coating of claim 1, wherein the wear-resistant coating is produced by a Physical Vapor Deposition-sputtering technique.

12. A gas turbine component having a wear-resistant coating applied to a surface of the component, wherein the wear-resistant coating has an alternating layered structure comprising a plurality of relatively hard ceramic layers and a plurality of relatively soft metallic layers, wherein the ceramic layers and the metallic layers are alternatingly positioned on top of one another in such a way that an external layer, which forms an outer surface of the wear-resistant coating, is designed as a ceramic layer, and wherein the external ceramic layer and a ceramic layer nearest the external layer of the wear-resistant coating are vertically segmented in the manner of a column such that each of the external ceramic layer and the ceramic layer nearest the external layer comprise layer columns, the layer columns extending through the layer in which the layer columns are located, the layer columns extending approximately perpendicular to the surface of the gas turbine component to which the wear-resistant coating is applied, wherein a metallic interlayer is interposed between the external ceramic layer and the ceramic layer nearest the external layer.

13. The gas turbine component of claim 12, wherein a bonding layer is provided between the wear-resistant coating and the gas turbine component.

14. The gas turbine component of claim 12, wherein all ceramic layers are vertically segmented in the manner of a column.

15. The gas turbine component of claim 12, wherein all metallic layers are compactly or vertically unsegmented.

16. The gas turbine component of claim 12, wherein the metallic layers are vertically segmented in the manner of a column.

17. The gas turbine component of claim 12, wherein the external ceramic layer which is vertically segmented in the manner of a column is segmented in the form of a columnar pillar, columnar rod, or columnar fiber.

18. The gas turbine component of claim 12, wherein the external ceramic layer which is vertically segmented in the manner of a column has a nanostructured design, a nanocrystalline design, nanolayered design, or a combination thereof.

19. The gas turbine component of claim 12, wherein successive ceramic layers are segmented with different orientations in the manner of a column.

20. The gas turbine component of claim 19, wherein the columns of successive ceramic layers are inclined in different directions in three-dimensional space.

21. The gas turbine component having a wear-resistant coating applied to the surface of the component of claim 12, wherein the wear-resistant coating is produced by the Physical Vapor Deposition-sputtering technique.

22. A wear-resistant coating applied to a surface of a gas-turbine component, wherein the wear-resistant coating has a layered structure comprising a plurality of relatively hard ceramic layers and a plurality of relatively soft metallic layers, wherein the ceramic layers and the metallic layers are alternatingly positioned on top of one another in such a way that an external layer, which forms an outer surface of the wear-resistant coating, is designed as a ceramic layer, and wherein the external ceramic layer of the wear-resistant coating and a ceramic layer nearest the external layer are vertically segmented in the manner of a column such that each of the external ceramic layer and the ceramic layer nearest the external layer comprise layer columns, the layer columns extending through the layer in which the layer columns are located, the layer columns extending approximately perpendicular to the surface of the gas turbine component to which the wear-resistant coating is applied, and wherein a metallic interlayer is interposed between the external ceramic layer and the ceramic layer nearest the external layer.

* * * * *